United States Patent [19]

Garskamp

[11] 4,074,216

[45] Feb. 14, 1978

[54] RECEIVER TUNING CIRCUIT

[75] Inventor: Arnoldus Garskamp, Eindhoven, Netherlands

[73] Assignee: U.S. Philips Corporation, New York, N.Y.

[21] Appl. No.: 726,267

[22] Filed: Sept. 24, 1976

Related U.S. Application Data

[63] Continuation of Ser. No. 549,063, Feb. 11, 1975, abandoned.

[30] Foreign Application Priority Data

Feb. 27, 1974 Netherlands ............................ 7402624

[51] Int. Cl.² ........................... H03H 5/12; H03J 3/06; H03J 5/04
[52] U.S. Cl. ......................................... 334/15; 334/11; 334/14; 325/458; 325/465
[58] Field of Search ....................... 334/15, 14, 16, 11, 334/55; 325/452, 458, 465

[56] References Cited

U.S. PATENT DOCUMENTS

| | | | |
|---|---|---|---|
| 3,588,706 | 6/1971 | Sakai et al. | 334/15 |
| 3,824,474 | 7/1974 | Sakamoto | 334/15 |
| 3,893,049 | 7/1975 | Bray | 334/15 |
| 3,980,968 | 9/1976 | Ma | 334/15 |
| 3,996,540 | 12/1976 | Yamada et al. | 334/15 |

Primary Examiner—Saxfield Chatmon, Jr.
Attorney, Agent, or Firm—Frank R. Trifari; Henry I. Steckler

[57] ABSTRACT

A receiver tuning circuit in which without operation of extra switches a change-over can be made from tuning by means of a continuously varying tuning voltage to tuning by means of one of a number of adjusted tuning voltages by using a capacitor controlled by an automatic tuning correction current source circuit for obtaining said voltage, and an automatic switch for applying the desired tuning voltages to this capacitor.

5 Claims, 2 Drawing Figures

RECEIVER TUNING CIRCUIT

This is a continuation of application Ser. No. 549,063, filed Feb. 11, 1975, now abandoned.

The invention relates to a receiver tuning circuit having a tuning section tunable by means of a tuning voltage obtained from a capacitor whose charge can be changed by means of a current source circuit controllable by at least an automatic tuning correction signal, while furthermore a desired tuning voltage can temporarily be applied to said capacitor with the aid of a switch controllable by an operating device so as to make it possible to immediately tune to a desired frequency independently of the previous charge condition of said capacitor.

A tuning circuit of the kind described above is known from German Offenlegungsschrift No. 2,025,369 in which the said capacitor is optionally connected to a tuning potentiometer by means of a push-button switch for applying a voltage determined by said potentiometer to said capacitor as long as the push-button switch is operated, whereafter a tuning frequency thus selected is corrected with the automatic tuning correction signal through the current source circuit and the charge of said capacitor.

It is an object of the invention to enhance the comfort of operation of such a tuning circuit.

To this end a tuning circuit of the kind described in the preamble is characterized in that the operating device includes a memory for storing the last adjusted state of said operating device, and a signal generator which upon operation of the operating device applies a signal to an output thereof, which output is coupled to a time-constant circuit coupled to said switch for maintaining said switch switched on for a period determined by the time-constant circuit independently of the operating duration of the operating device.

Due to the step according to the invention it is possible at any moment to ascertain, by means of the state of the memory, the last operating action of the operating device, maintaining the advantage of a temporary tuning voltage supply to the capacitor so that subsequently other functions such as, for example, a tuning correction device or a search tuning device can become active on said capacitor through the current source circuit.

The invention will now be described with reference to the drawing.

Figure 1:
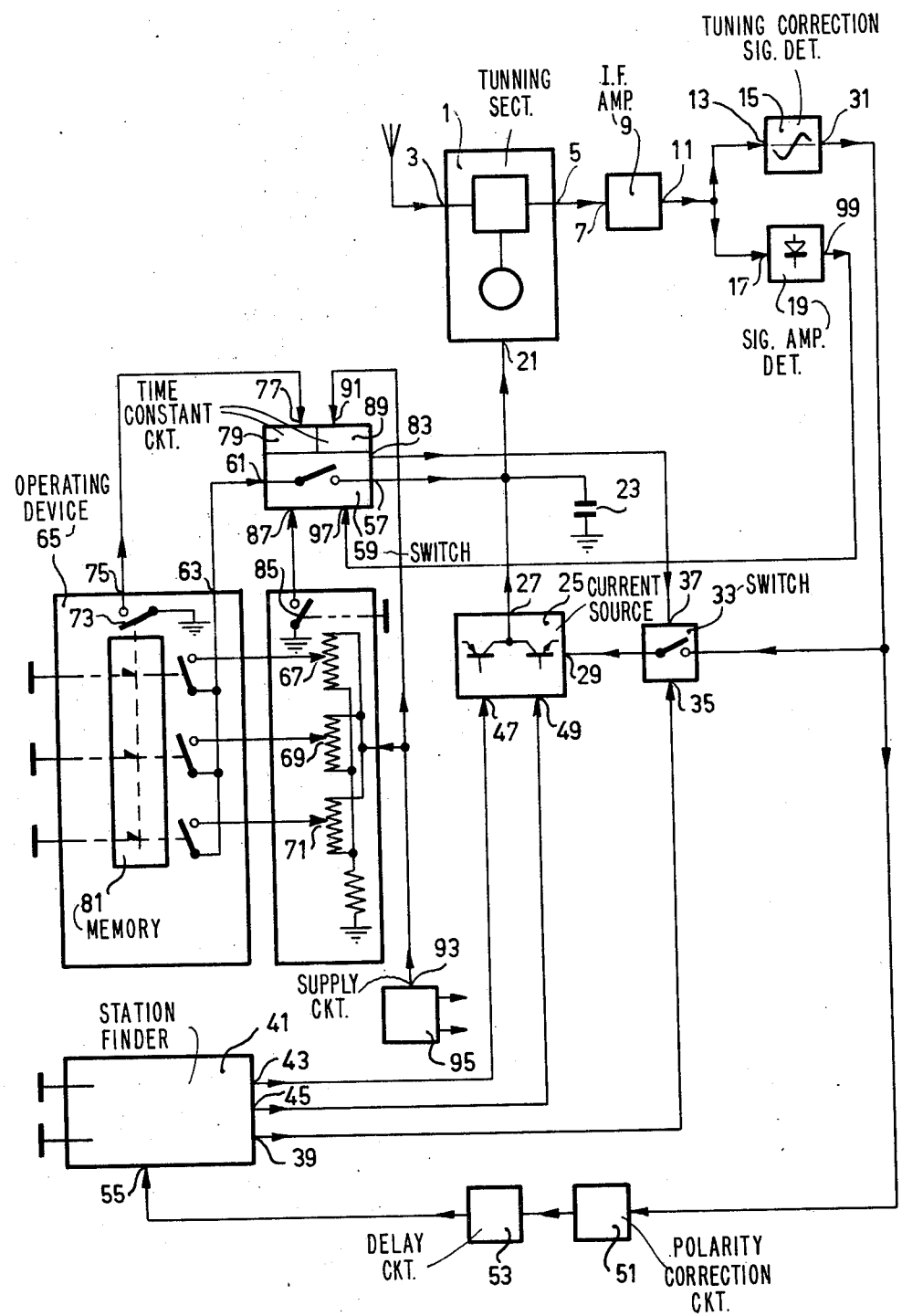
FIG. 1 shows by way of a block-schematic diagram a receiver tuning circuit according to the invention.

In FIG. 1 a tuning section 1 has an input 3 to which a received RF signal is applied and an output 5 from which an IF signal is obtained. This IF signal is applied to an input 7 of an IF amplifier 9 and derived in an amplified form from an output 11 thereof and applied to an input 13 of a tuning correction signal detector 15 and an input 17 of a signal amplitude detector 19.

Furthermore, the tuning section 1 has an input 21 which receives a tuning voltage from a capacitor 23. The charge of the capacitor 23 can be changed with the aid of a current source circuit 25 for which purpose an output 27 thereof is connected to the capacitor 23 whose other end is connected to ground.

An input 29 of the current source circuit 25 is controlled by a tuning correction signal originating from an output 31 of the tuning correction signal detector 15. This correction signal can be rendered inactive with the aid of a switch-off device 33 incorporated in the connection between the output 31 and the input 29, and with the aid of signals applied to an input 35 or 37 thereof.

For this purpose the input 35 of the switch-off device 33 is connected to an output 39 of a station finder 41 two outputs 43, 45 of which are connected to inputs 47, 49 of the current source circuit 25. Thus, the station finder 41 can continuously bring about a charge or discharge of the capacitor 23 when the automatic tuning correction is switched off so that the tuning section 1 is continuously detuned. When a station is found, a signal is produced at the output 31 of the tuning correction signal detector 15, which signal causes stop signal at an input 55 of the station finder through a polarity correction circuit 51 and a delay circuit 53, and this for a certain period, for example, 1.5 seconds so that station finding is temporarily discontinued and the automatic tuning correction is activated. As a result, tuning is effected immediately and correctly at the frequency of the received station. If this station is not desired, further station finding can be continued after 1.5 seconds.

The capacitor 23 providing the tuning voltage for the tuning section 1 may be controlled not only by the current source circuit 25, but also by an output 57 of a switch 59 an input 61 of which is connected to an output 63 of an operating device 65.

A voltage originating from one of a plurality of tuning potentiometers 67, 69, 71 can be temporarily applied to the capacitor 23 with the aid of the operating device 65. When the device 65 is operated a signal is obtained to that end from a signal generator 73. This signal is applied through an output 75 of the operating device to an input 77 of a time-constant circuit 79. The time constant circuit 79 is coupled to the switch 59 and closes it for a certain time so that the capacitor 23 assumes the desired voltage of a selected potentiometer 67, 69 or 71.

The operating device 65 has a memory which is symbolically shown in the figure as a block 81. This memory 81 ensures that it can always be seen which potentiometers 67, 69 or 71 is interconnected to the output 63 of the operating device 65, while due to the action of the time-constant circuit 79 the voltage originating from this potentiometer is not continuously present at the capacitor 23. The said memory 81 may be either a mechanical or an electrical memory. When using a mechanical memory, the signal generator 73 may be an AFC switch which is present on many operating devices. When using an electrical memory, as is common practice with touch controls in the operating device 65, any change of state of this memory may be converted in a simple manner into a signal applied to the output 75.

The switch 59 has an output 83 which applies a signal to the input 37 of the switch-off device 33. This signal renders the automatic tuning correction inactive as long as the switch 59 is closed, as is the case when a tuning voltage is applied to the capacitor 23 with the aid of the operating device 65. The tuning correction is active again immediately when the switch 59 is open so that tuning is effected immediately and correctly when a selected station is received.

To be able to adjust the potentiometers 67, 69 or 71 easily, a switch 85, which can be operated manually, is connected to a further input 87 of the switch 59 which can be maintained closed with the aid of the manually operated switch 85 as long as is desired for adjustment.

Coupled to the switch 59 is a further time-constant circuit 89 which has an input 91 connected to an output 93 of a supply circuit 95. Thus, whenever the receiver is switched on, the switch 59 is maintained closed for some time so that firstly the station to which the operating device 65 is adjusted is tuned to, even if the station finder 41 were switched on. In that case the operating device 65 must have, for example, a mechanical memory 81, which is independent of the supply voltage, in order to maintain its adjustment also when the supply voltage is switched off.

Furthermore, the switch 59 has an input 97 which is connected to an output 99 of the signal amplitude detector 19. When the signal received by the receiver becomes too weak, the switch 59 can be closed via this path so that tuning to a frequency selected by the operating device 65 is maintained and is stil present when the received signal becomes stronger again. A further possibility, which may be particularly attractive for motor-car radios, is to incorporate a switch which can be operated in this manner between the capacitor and an output of a memory which can be coupled to that capacitor. When the field strength is sufficient, this memory may be written in with the voltage on the capacitor and when the field strength is insufficient, an output of this memory may be coupled to the capacitor for transferring the memory voltage to the capacitor. This memory may be, for example, a motor adjusting a potentiometer and operated with the aid of a control system. When the supply voltage drops out, the last adjusted state of the potentiometer is maintained.

The described tuning circuit may immediately change over from, for example, a search tuning state to a state tuned to a desired station without operating extra switches and only by operating the relevant operating members.

It will be evident that the switch tuning may be omitted, if desired.

Figure 2:
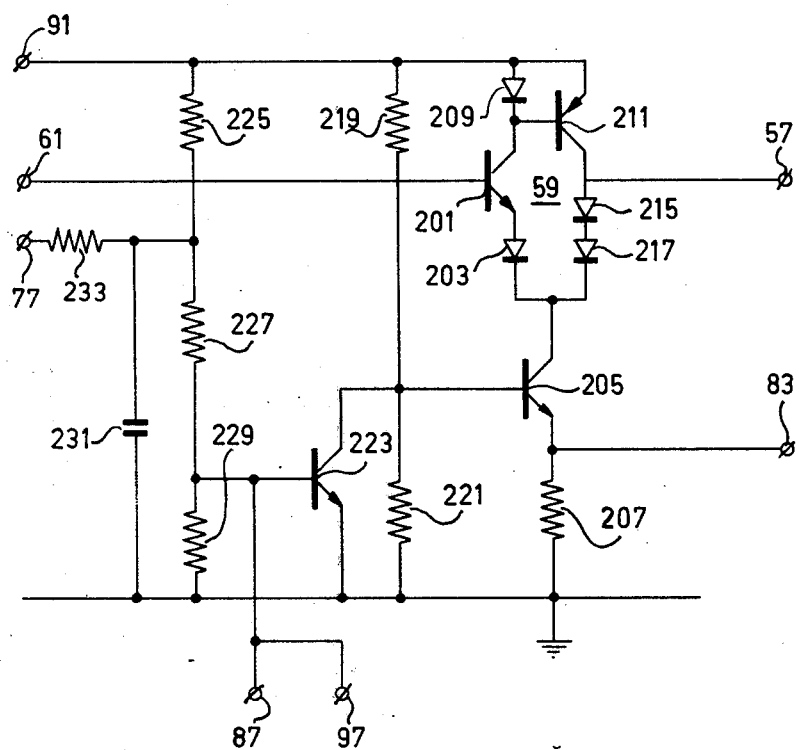
FIG. 2 shows by way of a principle circuit diagram a possible embodiment of part of the receiver tuning circuit according to the invention.

FIG. 2 shows a possible embodiment of the switch 59 and, coupled thereto, the time-constant circuits 79 and 89 of the receiver tuning circuit of FIG. 1. The inputs and outputs have the same reference numerals as the corresponding inputs and outputs in FIG. 1.

The input 61 of the switch 59 is connected to the base of a npn transistor 201. The emitter of this transistor 201 is connected through a diode 203 to the collector of an npn transistor 205 arranged as a current source whose emitter is connected to the output 83 and is furthermore connected to ground through a resistor 207.

The collector of the transistor 201 is connected through a diode 209 to the input 91 to which the supply voltage is applied. The diode 209 shunts the base-emitter path of a pnp transistor 211 which together with the diode 209 constitutes a current mirror circuit. The collector of the transistor 211 allows a current to flow through a series arrangement of two diodes 215, 217, which current has substantially the same intensity as the current flowing through the diode 203. Furthermore, the diode 217 is connected to the collector of the transistor 205, while the junction of the collector of the transistor 205 and the diode 215 is connected to the output 57.

The base of the transistor 205 is connected to a tap on a potential divider 219, 221 between the supply voltage and ground. This potential divider will raise the voltage at the base of the transistor 205 to such an extent that it produces a current, which is further determined by the emitter resistor 207, equally distributed over the collector branches with the diode 203 and the transistor 201 and with the diodes 217 and 215, respectively. When the circuit is designed in a integrated form, it can be achieved in a simple manner that the output 57 will always assume the same voltage as the input 61. Since the output 57 is connected to the capacitor 23, both a discharge and a charge of this capacitor 23 is possible. Charging is effected through the transistor 211 and discharging is effected through the diodes 215, 217. The circuit is independent of temperature influences. The diode 203 and consequently the diode 217 are provided to prevent a too large voltage difference at the base-emitter junction of the transistor 201.

The current source 205 can be turned off by connecting the base of transistor 205 to ground with the aid of a npn transistor 223 connected across the resistor 221. This is effected when the base of this transistor receives a voltage from a potential divider comprising three resistors 225, 227, 229. However, when the base of the transistor 223 receives a low voltage through the input 87 or the input 97, the transistors 223 is cut off and the transistor 205 conducts so that the switch 59 is closed.

The voltage at the base of the transistor 223 remains low for some time after switching on the supply voltage because a capacitor 231, which is connected to the junction between the resistors 225 and 227, must firstly be charged. Thus, the switch 59 is closed during that period.

Furthermore, the voltage at the base of the transistor 223 may be decreased by discharging the capacitor 231 through a resistor 233 to the input 77 when this input is earthed for a moment during operating device 65. The voltage at the capacitor 231 will subsequently increase in accordance with a certain time constant and after a certain time the transistor 223 conducts again and the switch 59, which was closed when the transistor 223 was cut off, will be open again.

The input 97 is interconnected to the input 87 so that the transistor 223 is also cut off and the switch 59 starts to conduct when the voltage at the input 97 becomes low upon a drop-out of a transmitter signal.

The switch 59 in this embodiment also acts as an amplifier so that the adjustments of the tuning potentiometer 67, 69 or 71 do not have any influence on the rate at which the charge of the capacitor 23 is changed.

What is claimed is:

1. A receiver tuning circuit comprising a tuning section having a tuning input, a capacitor means coupled to said tuning input for applying a tuning voltage thereto, a controllable current source coupled to said capacitor, a tuning correction signal detector means coupled between said tuning section and said current source for applying an automatic tuning correction signal to said capacitor means through said current source, and means for immediately tuning said tuning section to a selected frequency independently of the previous voltage on said capacitor comprising a first switch coupled to said capacitor and an operating device means for controlling said switch for an operating period, said operating device including a memory means for storing the last adjusted state of said operating device, at least one potentiometer and a generator means for effecting that a signal from said potentiometer is applied to said capacitor through said switch upon operation of said operating device, and said first switch including a first time constant circuit means coupled to said generator for maintaining said switch in an on position for a selected period of time independent of said operating period.

2. A receiver tuning circuit as claimed in claim 1, wherein said switch comprises a current source which can be influenced by an operating signal, said source being coupled to two parallel branches the first of which includes a transistor having an emitter coupled to said current source, a base coupled to an input of the switch, and a collector, a current mirror circuit having an input coupled to said collector and an output, the second branch including a pair of series connected diodes coupled to the current source and to said output of the current mirror circuit, and output of the switch being coupled to the pair of diodes.

3. A circuit as claimed in claim 1, further comprising a manually operable second switch means for obtaining a continuous coupling between said potentiometer means and said capacitor.

4. A circuit as claimed in claim 1 further comprising a supply circuit means for obtaining a desired tuning voltage, said memory means being independent of said supply circuit, said first switch further comprising a second time constant circuit means coupled to said supply circuit means for temporarily applying a tuning voltage determined by the potentiometer to said capacitor when the supply voltage is switched on.

5. A receiver tuning circuit comprising a tuning section having a tuning input, a capacitor means coupled to said tuning input for applying a tuning voltage thereto, a controllable current source coupled to said capacitor, a tuning correction signal detector means coupled between said tuning section and said current source for applying an automatic tuning correction signal to said capacitor through said current source, means coupled to said capacitor for immediately tuning said tuning section to a selected frequency independently of the previous voltage on said capacitor, a memory means coupled to said immediate tuning means for storing a tuning voltage corresponding to a selected frequency and signal amplitude detector means coupled to said immediate tuning means for effecting that said tuning voltage stored in said memory means is applied to said capacitor through said immediate tuning means when said signal amplitude goes below a selected value.

* * * * *